(12) United States Patent
Tanaka et al.

(10) Patent No.: US 10,625,443 B2
(45) Date of Patent: Apr. 21, 2020

(54) METHOD AND DEVICE FOR RELEASING RESIN FILM, METHOD FOR MANUFACTURING ELECTRONIC DEVICE, AND METHOD FOR MANUFACTURING ORGANIC EL DISPLAY DEVICE

(71) Applicant: HON HAI PRECISION INDUSTRY CO., LTD., New Taipei (TW)

(72) Inventors: Kohichi Tanaka, Osaka (JP); Yozo Narutaki, Osaka (JP); Katsuhiko Kishimoto, Osaka (JP)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 15 days.

(21) Appl. No.: 16/067,216

(22) PCT Filed: Jul. 22, 2016

(86) PCT No.: PCT/JP2016/071619
§ 371 (c)(1),
(2) Date: Jun. 29, 2018

(87) PCT Pub. No.: WO2017/115486
PCT Pub. Date: Jul. 6, 2017

(65) Prior Publication Data
US 2019/0022901 A1    Jan. 24, 2019

(30) Foreign Application Priority Data
Dec. 29, 2015    (JP) .................................. 2015-257623

(51) Int. Cl.
*H01L 21/683*    (2006.01)
*B29C 41/42*    (2006.01)
(Continued)

(52) U.S. Cl.
CPC .............. *B29C 41/42* (2013.01); *B65H 29/56* (2013.01); *H01L 21/67132* (2013.01);
(Continued)

(58) Field of Classification Search
CPC ........... H01L 21/67126; H01L 21/6835; H01L 21/68757; H01L 21/76251; H01L 21/7806;
(Continued)

(56) References Cited

U.S. PATENT DOCUMENTS

2008/0227005 A1* 9/2008 Tashiro .................... B41M 1/06
430/48
2012/0043438 A1* 2/2012 De Jong, Jr. .......... B82Y 10/00
248/205.1
2014/0093988 A1    4/2014 Kawata

FOREIGN PATENT DOCUMENTS

CN          103177998 A      6/2013
JP           8-108966 A      4/1996
(Continued)

*Primary Examiner* — Stephen W Smoot
(74) *Attorney, Agent, or Firm* — ScienBiziP, P.C.

(57) ABSTRACT

A method for releasing a resin film from the supporting substrate is provided. The method includes applying and hardening a liquid resin on the supporting substrate to form the resin film; forming an electronic element on the resin film; preparing for separating the supporting substrate into a first part and a second part; generating a partial release between the resin film and the first part, by relatively moving the first part and an end edge of the second part adjacent to the first part; and applying a blowing force with a gas or a liquid in a widthwise direction of the resin film in a parallel direction to the supporting substrate at an end part of an adhered face between the resin film exposed by the partial release and the first part.

14 Claims, 6 Drawing Sheets

(51) Int. Cl.
*H01L 21/67* (2006.01)
*H01L 51/00* (2006.01)
*B65H 29/56* (2006.01)
*H01L 21/78* (2006.01)
*H01L 27/32* (2006.01)
*H01L 51/56* (2006.01)
*B29K 79/00* (2006.01)
*B29L 31/34* (2006.01)

(52) U.S. Cl.
CPC ...... *H01L 21/6835* (2013.01); *H01L 21/7806* (2013.01); *H01L 27/3244* (2013.01); *H01L 51/003* (2013.01); *H01L 51/56* (2013.01); *B29K 2079/08* (2013.01); *B29L 2031/3475* (2013.01); *B65H 2301/44338* (2013.01); *B65H 2801/61* (2013.01); *H01L 51/0097* (2013.01); *H01L 2227/323* (2013.01); *H01L 2251/566* (2013.01)

(58) Field of Classification Search
CPC ............... H01L 27/32; H01L 27/3244; H01L 2227/326; H01L 51/003; H01L 51/0097; H01L 51/56; H01L 2251/566; B29C 41/42; B65H 29/56; B65H 2301/4422; B65H 2301/44338
See application file for complete search history.

(56) References Cited

FOREIGN PATENT DOCUMENTS

| | | |
|---|---|---|
| JP | 2000-053316 A | 2/2000 |
| JP | 2002-128388 A | 5/2002 |
| JP | 2014-074757 A | 4/2014 |
| JP | 2015-38001 A | 2/2015 |
| JP | 2015-083504 A | 4/2015 |
| TW | 200823142 A | 6/2008 |
| TW | 200921905 A | 5/2009 |
| TW | 201325904 A | 7/2013 |
| WO | 2008/032625 A | 3/2008 |

\* cited by examiner

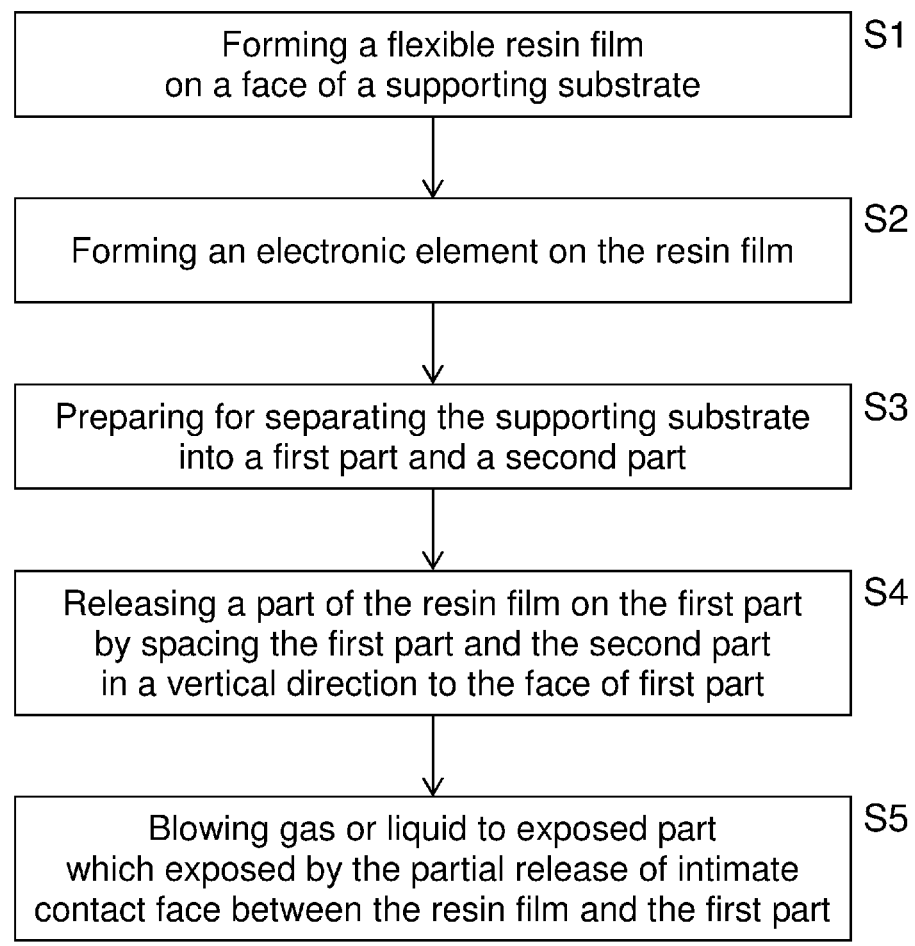
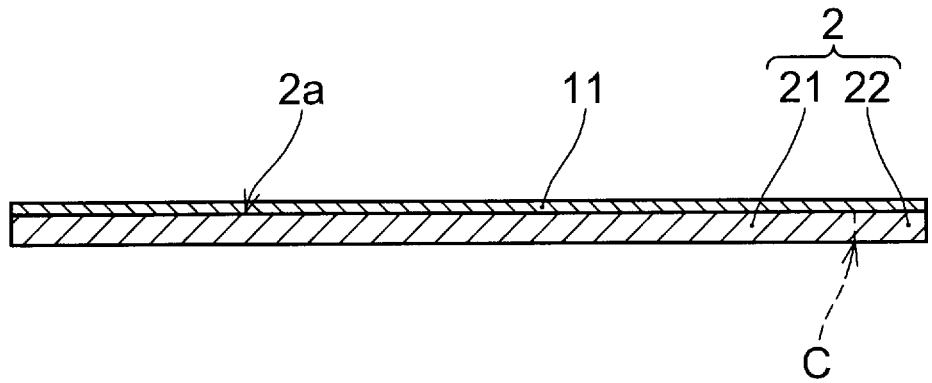

METHOD AND DEVICE FOR RELEASING RESIN FILM, METHOD FOR MANUFACTURING ELECTRONIC DEVICE, AND METHOD FOR MANUFACTURING ORGANIC EL DISPLAY DEVICE

TECHNICAL FIELD

The present disclosure relates to a method for releasing a resin film from a supporting substrate, as in a case where in order to form a flexible device for example, a flexible film is provided on a supporting substrate, and on the resin film, an electronic element is formed, and the supporting substrate is thereafter removed; and a method for manufacturing an electronic device using the releasing method. More particularly, the present disclosure relates to a releasing method and a releasing device which are capable of easily releasing a resin film without adversely affecting an electronic element on the film merely, by a mechanical operation without laser light beams irradiation.

BACKGROUND ART

In recent years, there has been increasing needs for electronic devices each having an impact resistance and flexibility, and electronic devices in which electronic circuits including electronic elements are formed on a surface of a resin film which is frequently used. An example of such devices is applied to a variety of electronic devices including displays such as liquid crystal displays or organic EL display devices, solar batteries and touch panels. In the case of manufacturing these devices, electronic elements or the like need to be formed on a flexible substrate, however, if an attempt is made to directly form an electronic element on the flexible substrate, since a part of the resin film is floated or curbed, thereby the flatness of the resin film is degraded, the electronic elements or the like cannot be formed in an accurate location. Thus, the electronic elements or the like are formed in a state in which the resin film is brought into intimate contact with a surface of a supporting substrate, and thereafter the resin film is released from the supporting substrate. In this case, on the resin film, the electronic elements and circuits are formed and thus it is needed to be released without imparting a stress to these elements or the like. Therefore, there is conventionally used a method for irradiation with laser light beams or light with a short wavelength by a flash lamp (hereinafter, referred to as laser light beams or the like), thereby weaken an intimacy force (adhesion) between the resin film and the supporting substrate, and then the resin film is released.

However, if irradiation with laser light beams or the like is carried out, in some kind of the electronic elements formed on the resin film, a special characteristic of the electronic elements themselves may degraded by laser irradiation with laser light beams or the like. Also, in order to release the resin film by irradiation with laser light beams or the like, a large, and expensive irradiation apparatus is required. Accordingly, in an example disclosed in Patent Document 1 for instance, as shown in FIG. 7, an adhesive layer 92 is formed at only a peripheral edge on a supporting substrate 91: on the adhesive layer 92 and all over the inside of the adhesive layer 92, a resin film 93 is formed; and on the resin film 93, an electric element 94 is formed and thereafter only a part of the adhesive layer 92 of the peripheral edge is irradiated with laser light beams or the like, and the resin film 93 and the supporting substrate 91 are separated and the supporting substrate is removed. That is, the resin film is bonded only at the peripheral edge of the supporting substrate 91, and is hardly bonded at the central part thereof, and further a part of the adhesive layer 92 is irradiated with laser light beams or the like to thereby weaken an adhesive force. However, in this method, even a small range of the peripheral edge must be irradiated with laser light beams or the like, and therefore, there is a need to prepare an expensive irradiation apparatus.

In addition, in Patent Document 2, as shown in FIG. 8A, a release layer 95 is provided at a central part of a supporting substrate 91, and on the release layer 95 and the supporting substrate 91 around there, a resin film 93 is directly formed. At this junction, the resin film is joined so that the adhesion between the release layer 95 and the supporting substrate 91 is greater than the adhesion between the release layer 95 and the resin film 93. Afterwards, in the location indicated by the arrow C in FIG. 8A, that is, at a part of the resin film 93 on the release layer 95, the resin film 93 is cut, thereby as shown in FIG. 8B, the resin film 93 on the release layer 95 with a weak adhesion is separated and then the resin film 93 is released.

PRIOR ART DOCUMENT

Patent Document

Patent Document 1: JP 2013-135181 A
Patent Document 2: JP 2013-168445 A

SUMMARY OF THE INVENTION

Problem to be Solved by the Invention

As described previously, in a method in which an adhesive layer is formed only at a peripheral edge part of a supporting substrate, there is a need to irradiate even a small range with laser light beams or the like. In order to irradiate with laser light beams or the like, the irradiation apparatus is required, and a very expensive apparatus for carrying out irradiation with laser light beams or the like must be prepared. This is a great problem in terms of cost reduction. In addition, the adhesive layer is not formed all over the supporting substrate, and must be formed in a limited location of only the peripheral edge part and thus there is a problem that it takes long time to form the adhesive layer, causing higher costs. Further, if an attempt is made to reuse the supporting substrate, a part coming into intimate contact (adhesion) with the supporting substrate at the peripheral edge of the resin film must be removed. Therefore, the removing step is required, and if irradiation with laser light beams or the like is carried out, it is considered that a glass or the like alters in quality, the conditions for subsequent irradiation with laser light beams or the like is affected, and it is difficult to reuse the supporting substrate.

Furthermore, in the method shown in FIG. 8A and FIG. 8B, the resin film can be released without carrying out irradiation with laser light beams or the like. However, the adhesion (intimacy) strength on the intimate contact side with the supporting substrate of the release layer must be large, and the intimacy strength on the intimate contact side with the resin film must be smaller than the intimacy force (adhesion) on the supporting substrate side. Therefore, there is a problem that conditions for selection and film forming of the material for the release layer and the resin film is difficult. In addition, in this case also, the release layer is not formed all over the supporting substrate, and therefore, mask forming or etching in accordance with the photolithography step must be carried out, and hence, there is a problem that the steps become complicated. Further, in view of reuse of the supporting substrate, it is preferable that the release layer is left as it is, and therefore, the work of removing only the resin film at the peripheral edge is difficult.

The present disclosure has been made in order to solve the above-described problem, and an object of the present disclosure is to provide a method for releasing a resin film which is capable of mechanically easily releasing the resin film without carrying out the complicated step of partially forming an adhesive layer or a release layer.

Another object of the present disclosure is to provide a method for, using the method for releasing the resin film, manufacturing an organic EL display panel in particular.

A still another object of the present disclosure is to provide a device for releasing a resin film which is capable of mechanically easily releasing a resin film from a supporting substrate without carrying out irradiation with laser light beams or the like.

Means to Solve the Problem

The present inventors repeatedly made the earnest research in order to release the resin film from a supporting substrate, after forming an electronic element on a resin film, without degrading the element characteristics by applying a stress to the electronic element, and consequently, found out that an adhesion between the resin film and a supporting substrate is weakened to an extent such that an end part of the resin film is not released from the supporting substrate during the manufacturing steps; the supporting substrate is separated into a first part and a second part and then these two parts are spaced from each other in a vertical direction to a surface of the first part, and a part of the resin film on the first part is thereby released, and gas such as air or nitrogen or pure water, or alternatively liquid such as alkali ion water is blown to an exposed end part of an intimate contact (adhered) face between the exposed resin film by the release and the first part, at a constant pressure in a widthwise direction of the resin film, and a resin film is thereby easily released without imparting a stress to the electronic element. In the case of blowing the liquid, there is attained an advantageous effect of swelling the resin film and then accelerating a release by blowing the warmer liquid of which temperature is increased, in particular the liquid of 50° C. or more such as hot water of 50° C. However, in a case where the electronic element is an organic EL display device, it is recommended to limit the temperature of the liquid to 80° C. or less in order to prevent degradation of an organic material by a heat.

As long as an part at which no electronic element is present is selected as a location to be separated into the first part and the second part, there is no serious problem even if a force of releasing a part of the resin film is great when the supporting substrate is separated into the first part and the second part and then these two parts are spaced from each other, however, in a case where a force of spacing the first part and the second part from each other in the vicinity of the electronic element, a stress is imparted to the electronic element, and therefore, it is preferable that the above force of spacing be a force to an extent such that such a stress is not imparted. The present inventors repeatedly made the earnest research, and consequently, found out that it is preferable to obtain the adhesion to an extent such that, avoid a release between the resin film and the first part during the manufacturing steps, and a stress is not imparted to the electronic element, and specifically, the adhesion is set to 0.1N/10 mm or more and 1 N/10 mm or less at a 90° peeling strength by the method of JIS Z 0237 to be thereby able to release the resin film by a simple mechanical force without imparting a stress to the electronic element.

A method for releasing a resin film of the present disclosure is a method of releasing a resin film formed adhered with a surface of a supporting substrate, from the supporting substrate, the method comprising: a step of preparing for separating the supporting substrate into a first part and a second part; a step of generating a partial release between the resin film and the first part of the supporting substrate, by relatively moving the first part of the supporting substrate and at least an end edge on a side of the first part of the second part so as to be spaced from each other in a vertical direction to a surface of the first part, while the resin film coming into adhesion with a surface of the second part of the supporting substrate; and a step of applying a blowing force with a gas or a liquid at a constant pressure in a widthwise direction of the resin film in a parallel direction to the supporting substrate at an end part of an adhered face between the resin film exposed by the partial release and the first part of the supporting substrate. It is preferable that blowing of the liquid be blowing of liquid of 50° C. because the resin film is swelled and releasing is accelerated.

A method for manufacturing an electronic device of the present disclosure is a method for manufacturing an electronic device having a flexible substrate, comprising: a step of forming a flexible resin film on a surface of a supporting substrate having a first part and a second part; a step of forming an electronic element on the resin film; and a step of releasing the resin film formed the electronic element thereon, from the supporting substrate, wherein the releasing of the resin film is carried out by the method according to any one of claims 1 to 9.

A method for manufacturing an organic EL display device of the present disclosure is a method for manufacturing an organic EL display device having an organic EL element on a flexible substrate, the method comprising: applying and hardening a liquid resin on a supporting substrate, forming the flexible substrate, and forming, on the flexible substrate, the organic EL element comprising TFT, in a matrixed shape, and forming a sealing member for sealing the organic EL element; separating the supporting substrate into a first part and a second part, the first part including a part at which the sealing member is formed, and the second part being other than the first part; generating a partial release between the resin film and the first part of the supporting substrate in a state of the resin film coming into adhesion with a surface of the second part of the supporting substrate, by relatively moving the first part of the supporting substrate and at least the end edge on a side of the first part of the second part in parallel to each other and so as to be spaced from each other in a vertical direction to a surface of the first part; and applying a pressure with a gas or a liquid so as to be parallel to the supporting substrate to an end part of an adhered face between the resin film exposed by the partial released and the first part of the supporting substrate. It is preferably that blowing of the liquid be carried out with a hot liquid of which temperature is increased. In particular, it is preferable that the above blowing is blowing of a liquid of 50° C. or more because the resin film is swelled and releasing is accelerated. However, as described previously, it is preferable to limit the temperature of the liquid to 50° C. or less in order to prevent degradation of an organic material by a heat.

A device for releasing a resin film of the preset disclosure is configured comprising: a pinching tool for pinching a second part, the pinching tool pinching all over a widthwise direction the second part of a supporting substrate having a first part and a second part, the supporting substrate being provided with a resin film adhered on a surface thereof; a holding tool for holding the first part, the holding tool being limited in a movement in a vertical direction to a surface of the first part and being able to move in a parallel direction to the surface of the first part and in a direction connecting the first part and the second part to each other; a first driving part for spacing the pinching tool and the holding tool from each other in the vertical direction while maintaining parallelism between an end edge on a side of the first part of the second part and the first part; and a blowing tool for applying a gas or liquid pressure from a gap formed between the resin film and the surface of the first part when a part of the resin film is released from the first part by a release between the first part and the second part. It is preferable that the liquid blowing tool be equipped with a heating device for increasing the temperature of the liquid and a thermometer for measuring the temperature thereof, and it is further preferable that this tool be provided with a control system that feeds back the measured value of the thermometer and keep the temperature of the liquid at a desired value.

Effects of the Invention

According to a method for releasing a resin film of the present disclosure, a supporting substrate is separated into a first part and a second part, and a surface of the first part and at least end edge on a side of the first part are spaced from each other in a vertical direction of the surface of the first part. Therefore, a part of a resin film coming into intimate contact with a first part of a supporting substrate is released at a predetermined length all over a widthwise direction of the resin film, and the resin film tensions at an angle θ based on a step difference between the second part and the first part. In a state in which the part of the resin film is released from the first part of the supporting substrate and then the resin film forms the angle θ, gas or liquid is blown towards an end part of an intimate contact face between the resin film exposed by the release of the part of the resin film and the supporting substrate and thus the resin film is not pulled and is softly released. At this junction, it is preferable that the released resin film tension between the second part and the first part so as not hang on the first part of the supporting substrate. From the viewpoint of tensioning, a method for dropping the first part by its own weight is also available, however, the first part is not vertically moved, and can be tensioned so as to space the second part in the vertical direction to the first part. This tensioning is not intended to release the resin film and thus the resin film is easily released without imparting a stress to an electronic element. In addition, in a case where a liquid is blown, the resin film is swelled and easily released by blowing a heated liquid, in particular a hot liquid such as hot water of 50° C. In a case where the electronic element is an organic EL display device, the temperature of the liquid is set to 80° C. or less to be able to prevent an organic material which is an essential constituent element from degradation by a heat, and an organic EL display device with a good display quality can be obtained.

According to a method for manufacturing an electronic device or an organic EL display device of the present disclosure, each element of the electronic device or the organic EL display device is formed on a resin film coming into intimate contact with a supporting substrate and thereafter the resin film is released by the above-described method, and therefore, each element of the electronic device is not degraded due to laser light beams or a mechanical stress, and an electronic device with very excellent electrical characteristics or an organic EL display device with an excellent display quality can be obtained.

According to the device for releasing a resin film of the present disclosure, relative spacing of a first part and a second part in the above-described releasing method or relative movement in a parallel direction to a surface of a supporting substrate is automatically made, therefore the electronic device or the like can be mass-produced.

BRIEF DESCRIPTION OF THE DRAWINGS

FIG. 1 is a flowchart showing a method for manufacturing an electronic device of an embodiment of the present disclosure.

FIG. 2A is an illustrative view of a cross section in the step S1 of the manufacturing method of FIG. 1.

EMBODIMENT FOR CARRYING OUT THE INVENTION

Next, with reference to the drawings, a method for releasing a resin film of an embodiment of the present disclosure, and a method for manufacturing an electronic device of an embodiment of the present disclosure will be described. In FIG. 1, a flowchart showing the embodiment of a method for manufacturing an electronic device of the present disclosure is shown, and in FIG. 2A to FIG. 2F, illustrative views of cross sections in the respective steps are respectively shown.

Figure 2B:
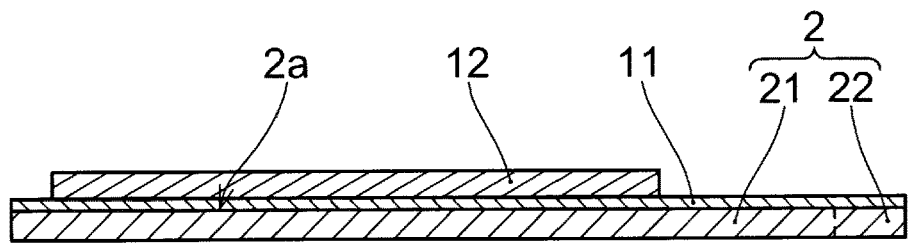
FIG. 2B is an illustrative view of a cross section in the step S2 of the manufacturing method of FIG. 1.
Figure 2C:
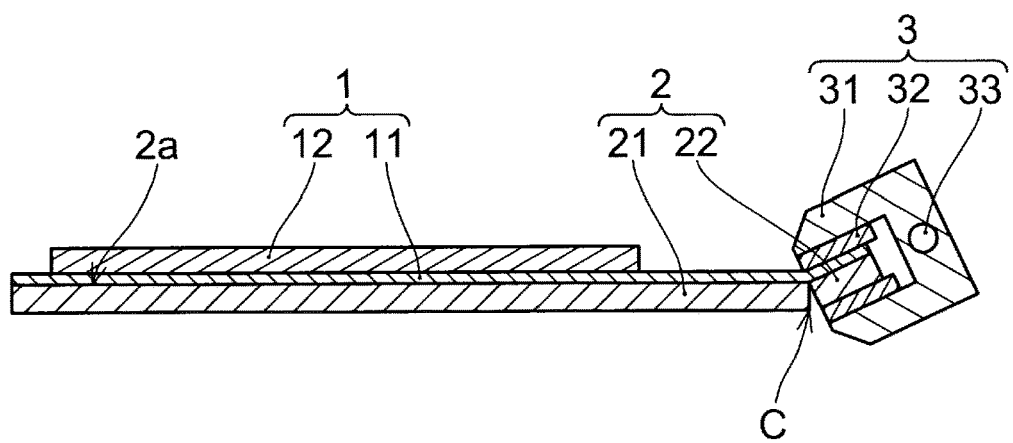
FIG. 2C is an illustrative view of a cross section in the step S3 of the manufacturing method of FIG. 1.

In the method for manufacturing the electronic device according to the present embodiment, first, as shown in FIG. 2A, a flexible resin film 11 is formed on a surface 2a of a supporting substrate 2 having a first part 21 and a second part 22 (S1). As shown in FIG. 3, which is the perspective view in the state of FIG. 2D, the first part 21 and the second part 22 are able to be separated from each other along a widthwise direction of the resin film 11 and then the second part 22 is separated to be formed like a narrow paper tablet. Next, as shown in FIG. 2B, an electronic element 12 is formed on the resin film 11 (S2). Although in FIG. 2B to FIG. 2G, an electric element 12 is schematically illustrated, in practice, as shown in FIG. 3, a plurality of electronic devices 1 are formed on a large resin film 11. Then, as shown in FIG. 2C, the supporting substrate 2 is prepared to be separated into the first part 21 and the second part 22 (S3). The preparation for separation means that in a case where the supporting substrate 2 is made of a glass, a scribe line is imparted to a back surface of the glass (an opposite surface to a surface on which the resin film 11 is formed) and then the glass is cut, or alternatively, in a case where the supporting substrate 2 is made of metal plate or the like, and the first part 21 and the second part 22 are bonded with each other so as to be easily attachable to or detachable from each other, it means to make the support substrate to be easily separate each other.

Figure 2D:
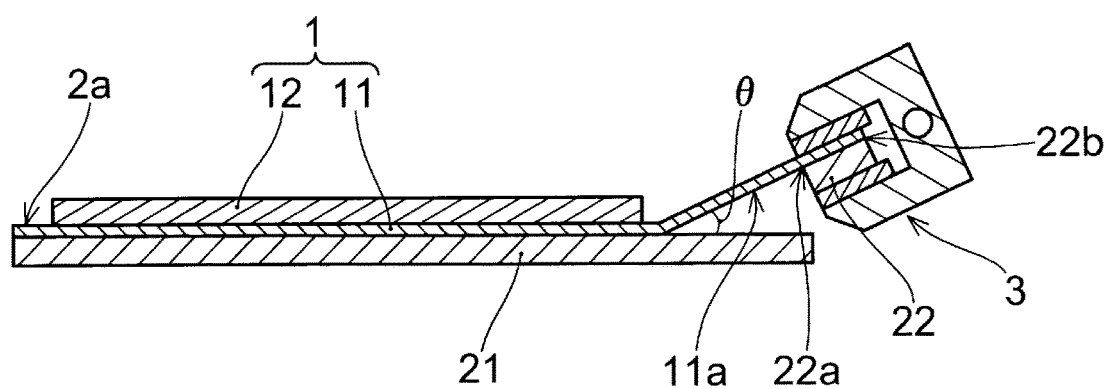
FIG. 2D is an illustrative view of a cross section in the step S4 of the manufacturing method of FIG. 1.
Figure 3:
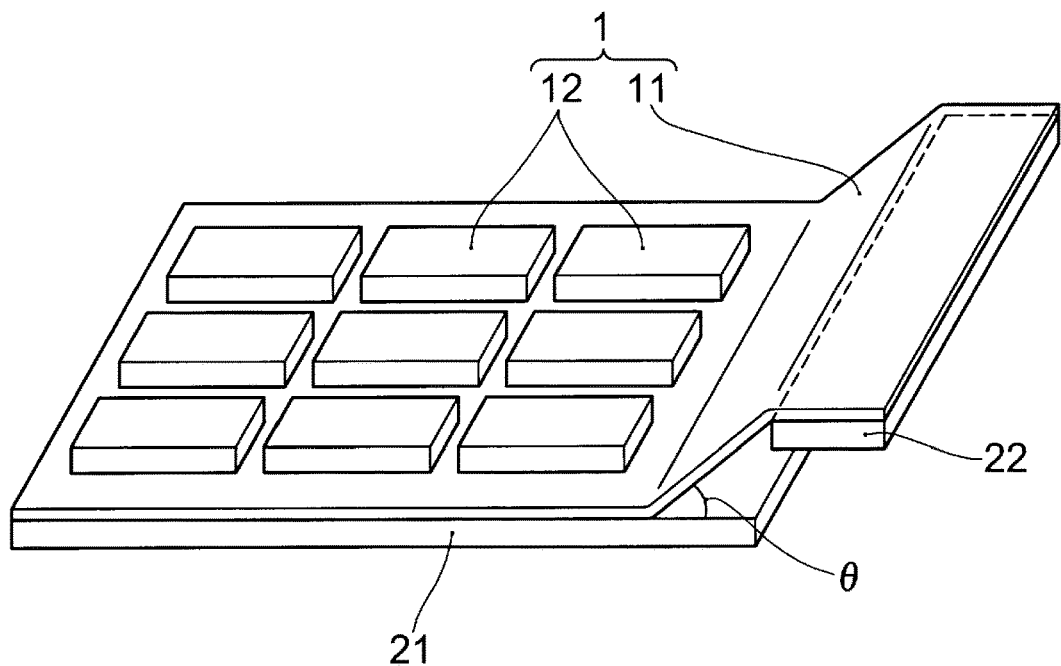
FIG. 3 is a perspective illustrative view of a state which is equivalent to that of FIG. 2D.

Afterwards, as shown in FIG. 2D and FIG. 3, in a state in which the resin film 11 comes into intimate contact with a surface 2a of the second part 22 of the supporting substrate 2, the first part 21 of the supporting substrate 2 and at least an end edge 22a of the second part 22 adjacent to the first part 21 are relatively moved so as to be spaced from each other in a vertical direction to a surface 2a to thereby generate a partial release part 11a between the resin film 11 and the first part 21 of the supporting substrate 2 (S4). Although in FIG. 2D, the released resin film 11 extend linearly up to a part pinched by a pinching tool 3 and the second part 22 inclines to the first part 21, in FIG. 3, the second part 22 is illustrated so as to be parallel to the first part 21. This suggests that either aspect is acceptable if conditions are met. The expression "at least end edge 22a on a side of the first part 21 of the second part 22" means that the entirety of the second part 22 does not need to be spaced, and in order to release the resin film 11, it is sufficient if the location of the end edge 22a is spaced from the surface 2a of the first part 21. Therefore, as shown in FIG. 2D, an end edge 22b which is opposite to the end edge 22a may be spaced at the same time, or alternatively, while the side of the end edge 22a is spaced from the surface 2a and the side of the end edge 22b is not spaced, the second part 22 may lower to the right towards the end edge 22b in the FIG. 2D. In addition, the expression "a state in which the resin film 11 comes into intimate contact with a surface 2a of the second part 22" means that although it is essentially preferable that the resin film 11 come into intimate contact the surface from one end to the other end in widthwise direction thereof, when the first part 21 and the second art 22 are spaced from each other, it is sufficient that the resin film 11 comes into intimate contact therewith from one end to the other end in widthwise direction thereof to an extent such that a uniform releasing force is applied to the resin film 11.

Figure 2E:
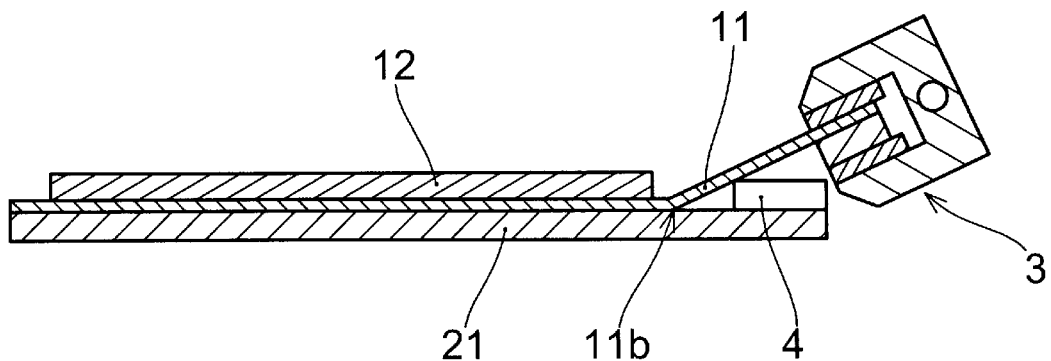
FIG. 2E is an illustrative view of a cross section in the step S5 of the manufacturing method of FIG. 1.
Figure 2F:
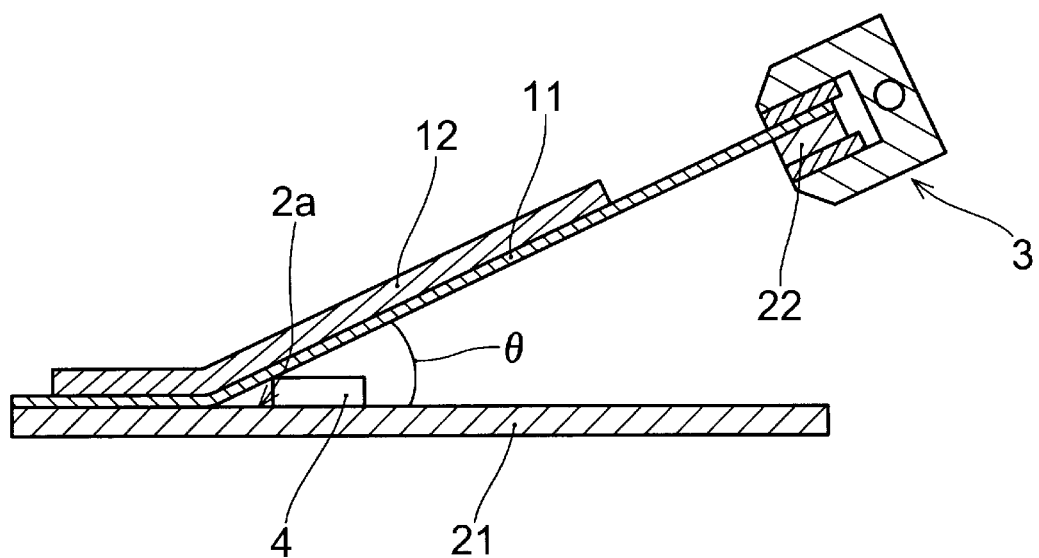
FIG. 2F is an illustrative view of a cross section of a state in which a resin film is further released from the state of 2E.
Figure 2G:
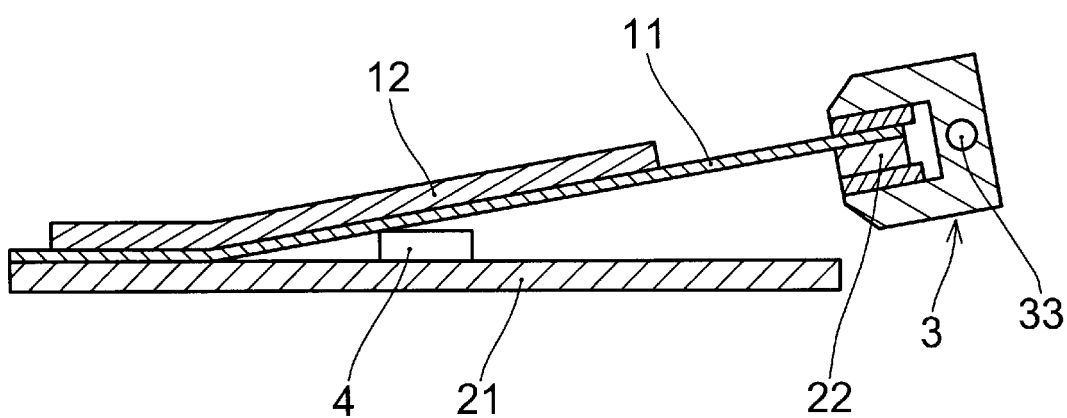
FIG. 2G is an illustrative view of a cross section showing another example of a state in which a resin film is further released from the state of 2E.

Subsequently, as shown in FIG. 2E and FIG. 2F, with respect to an end part 11b of an intimate contact (adhered) face between the resin film 11 exposed by a partial release of the resin film 11 and the first part 21 of the supporting substrate 2, a blowing force with gas or liquid at a constant pressure in a widthwise direction of the resin film 11 is applied by a blowing tool 4, and the resin film 11 on which the electronic element 12 has been formed is thereby released from the supporting substrate 2 (S5). At this junction, it is preferable to space the second part 22 in the vertical direction, as shown in FIG. 2F, or alternatively, to pull the second part in a direction in which the resin film extend, as shown in FIG. 2G, so that the released resin film does not hang on the first part 21. In addition, the intimate contact face between the resin film 11 and the supporting substrate 2 is gradually separated from each other and then the exposed end part 11b of the intimate contact face advances towards an end part of the supporting substrate 2, therefore, as shown in FIG. 2F, it is preferable that the blowing tool 4 be moved to approach the expose end part 11b, however, the blowing tool 4 may be secured as it is.

The example shown in FIG. 2G is an example in which after the first part 21 and the second part 22 are temporarily spaced from each other, concurrently with a release of the resin film 11, instead of lifting the second part 22 in the vertical direction, the second part 22 is rotated about a supporting shaft 33 of the pinching tool 3 so as to thereby pull the resin film 11 released, in the parallel to the surface 2a of the supporting substrate 2. Although the resin film 11 is thus pulled by rotation of the supporting shaft 22 of the pinching tool 3, the pressure of gas or liquid is applied to the exposed end part 11b of the intimate contact face by way of the blowing tool 4, and therefore, the resin film 11 is easily released, and a force exerted by rotation of the pinching tool 3 is hardly applied. Hence, a stress is not imparted to the electronic element 12 while the released resin film 11 is prevented from hanging on the supporting substrate 2.

The method for releasing the resin film 11 of the present embodiment is the same as the method for releasing the resin film in the method for manufacturing the electronic device, and is carried out in accordance with the procedures shown in FIG. 2C to FIG. 2F. Briefly, in order to release the resin film 11 formed in intimate contact with the surface 2a of the supporting substrate 2 having the first part 21 and the second part 22, the supporting substrate 2 is relatively moved so that the first part 21 and at least the end edge 22a of the second part 22 adjacent to the first part 21 are spaced from each other in the vertical direction to the surface 2a; and gas or liquid is blown to the exposed end part 11b on the intimate contact face that is partially released and exposed, and the resin film is thereby released. In a case where a liquid is blown, the resin film can be swelled by blowing the liquid of which temperature is increased, in particular blowing a hot liquid of 50° C. or more, and therefore, there is attained an advantageous effect that releasing is accelerated more remarkably.

The supporting substrate 2 is intended so as not to cause inconvenience in forming an electronic element by the resin film slackening or curling in forming the electronic elements on a flexible resin film, and any kind of substrate is available as long as one surface thereof is a flattened surface. That is, the resin film 11 is secured to the supporting substrate 2, the electronic element 12 is formed on the supporting substrate. Thereafter, the resin film 11 is released from the supporting substrate 2, and an electronic device 1 having a flexible substrate is manufactured. The supporting substrate 2 is used as a substrate for that purpose. In the present embodiment, the supporting substrate 2 is scheduled so as to be able to be separated into the first part 21 and the second part 22. This separation is scheduled to be carried out from one end to the other end in the widthwise direction of the supporting substrate 2 (in a vertical direction to a direction in which the resin film 11 is supposed to be released). In the example shown in FIG. 2A, a glass is used as a material for the supporting substrate 2 and thus is not distinguished as a first part and a second part of the supporting substrate 2, however, in the step of preparation for subsequent separation, the supporting substrate 2 is cut after being scribed at the boundary part (supposed separation line) C between the first part 21 and the second part 22. The boundary part (supposed separation line) C may be provided in the middle of forming position of the electronic element 12 without being limitative to formation on the side of the end part of the supporting substrate 2 as shown in FIG. 2A. Since almost no external force is applied except of the initial release, the electronic element is hardly affected. However as shown in FIG. 2A, it is preferable that the boundary part is formed at the side of the end part of the supporting substrate, because as long as the boundary part C is provided in the side of the end part where a main body of the electronic element is not formed and electrical wires are only formed, even if the adhesion between the resin film 11 and the supporting substrate 2 is somewhat great, the electronic element is not affected at the time of the initial release. In addition, if the second part 22 is formed on the side of the end part, the supporting substrate can be reused, and if an elongated supporting substrate 2 is utilized, even if the second part 22 is gradually discarded, it is possible to reuse the supporting substrate 2 several times or more.

Irradiation with laser light beams has been conventionally carried out at the time of release of the resin film 11 and thus a glass has been used to transmit the laser light beams, whereas in the present embodiment no laser irradiation is carried out and thus there is no need to use a glass. However, as in an organic EL display device or the like, for example, in a case where a device having a TFT element is manufactured, heat treatment of the order of 500° C. is required, therefore, it is desirable that there is not so large difference in thermal expandability in achieving matching of deformability (such as expansion and shrinking) between the supporting substrate 2 and the resin film 11. In place of a glass, a metal plate, a ceramics substrate, or a semiconductor wafer (semiconductor substrate) or the like may be used. Although the term "ceramics substrate" denotes a general sintered body obtained by burning inorganic material in a plate-like shape, a substrate such as alumina ($Al_2O_3$) is exemplified as a practical substrate. In the present embodiment, the supporting substrate 2 needs to be separated into the first part 21 and the second part 22, in the case of a material which is difficult to be cut, as in a metal plate, it is preferable to temporarily bond a preset one, to temporarily secure the material with the use of a fastening bracket, or to use such a material so as to be able to easily separated by a magnet or the like.

The resin film 11 may be cured by coating and burning (hardening) a liquid resin material onto the supporting substrate 2, or alternatively, the one formed in a film-like shape may be bonded on the supporting substrate 2. However, in a case where a film is bonded, a double-sided adhesive layer is required, the related handling such as transportation of the double-sided adhesive layer is very cumbersome, and an adhesive action is also complicated, and therefore, it is convenient to coat and burn (harden) the liquid resin material.

Figure 5:
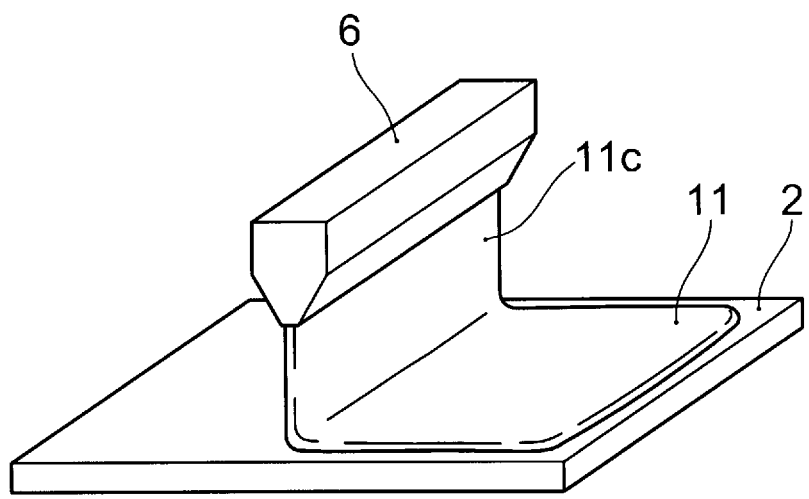
FIG. 5 is a view illustrating an example of coating a resin material.

Although any coating of the resin material 11c is available as long as such coating is a method in which film thickness control is possible, as shown in FIG. 5 for example, the material can be coated using a coating method such as slit coating. That is, while the resin material 11c is supplied to a slot die 6, while the resin material 11c is ejected in a band shape from a tip end part of the slot die 6, the slot die 6 is sequentially moved, and the resin material is thereby coated. Even if the amount of ejection of the resin material 11c is not completely uniform, a flattened surface having a uniform surface is obtained after time intervals of several minutes have elapsed. The resin material 11c may be coated by another method such as spin coating for example, in place of slit coating. Although spin coating is not suitable in terms of use efficiency of material in a case where a large resin film is formed, it is possible to obtain a resin film 11 coming into intimate contact with the supporting substrate 2 and having a flat surface.

The adhesion (intimacy) strength between the resin film 11 and the supporting substrate 2 is essential as well. That is, when the first part 21 and the second part described previously are spaced from each other in the vertical direction, the resin film 11 is partially released from the first part 21. A force of spacing the first part 21 and the second part 22 from each other depends on the adhesion between the resin film 11 and the supporting substrate 2. This phenomenon appears at the angle θ formed between the resin film 11 and the first part 21 when a part of the resin film 11 is released. That is, as the adhesion increases, the force of releasing the first part 21 and the second part 22 from each other increases, and the angle θ increases as well. On the other hand, as the intimacy control decreases, the force of spacing these two parts weakens, and the angle θ decreases as well. As described previously, if the adhesion is too small, an end part of the resin film 11 is released from the first part 21 of the supporting substrate 2 during the work of forming the electronic element 12, and there is a danger that the characteristics of the electronic element 12 that is formed on the resin film 11 are adversely affected as well. Alternatively, if the adhesion is too great, when the resin film 11 is released, the electronic element 12 that is formed on a surface of the resin film 11 is adversely affected, and the element characteristics are degraded as well.

With respect to the durability (workability) and easiness of release in the manufacturing steps, the present inventors studied an effect thereon, in units of 100 samples by the respective adhesions while variously changing the degrees of adhesions. The result is shown in Table 1. In Table 1, double circle (⊚) indicates very good (yields: 98%), single circle (○) indicates good (yields: 95% or more), and cross mark (x) indicates faulty (yields: less than 90%). With respect to the durability in the manufacturing steps, if a release was observed at an end edge of the resin film 11 during work, it was determined to be faulty. In addition, with respect to the easiness of release, if an inoperative substrate was found from among the TFT substrates for organic EL display device, it was determined to be faulty. From the result of Table 1, it is preferable to adjust the adhesion is 0.1 N/10 mm or more and 1 N/10 mm or less and further preferably 0.15 N/10 mm or more and 0.5N/10 mm or less, at the 90° peeling strength by the method of JIS Z 0237.

TABLE 1

| | Adhesion strength (N/10 mm) | | | | | | | | | | | | | |
|---|---|---|---|---|---|---|---|---|---|---|---|---|---|---|
| | 0.05 | 0.1 | 0.15 | 0.2 | 0.3 | 0.4 | 0.5 | 0.6 | 0.7 | 0.8 | 0.9 | 1.0 | 1.1 | 1.2 |
| Durability in manufacturing steps | X | ○ | ⊚ | ⊚ | ⊚ | ⊚ | ⊚ | ⊚ | ⊚ | ⊚ | ⊚ | ⊚ | ⊚ | ⊚ |
| Easiness of release | ⊚ | ⊚ | ⊚ | ⊚ | ⊚ | ⊚ | ⊚ | ○ | ○ | ○ | ○ | ○ | X | X |

Even if the intimacy strength is not included in this range, there is no problem in particular as long as the separation part (boundary part C) between the first part and the second part 22 is set in a location in which the electronic element 12 is not affected. In order to adjust the adhesion, there is proposed a technique for, prior to coating the resin material 11c, coating on the supporting substrate 2 an intimacy improvement/surface altering agent such as a silane coupling agent in a very thin layer, and then, coating the resin material 11c; or a technique for making such adjustment by control of a burning profile and the like. Using the burning conditions in which the intimacy strength can be reduced by accelerating a heating speed and can be increased by reducing a heating speed, it is possible to obtain the resin film 11 coming into intimate contact with the supporting substrate 2 by way of such burning condition.

In addition, when the coated resin material 11c is heated (burned) by increasing the temperature up to a curing temperature, up to 450° C. for example, an interface layer which is not shown is formed between the resin film 11 and the supporting substrate 2. If this interface layer is irradiated with light of a short wavelength, the layer alters in quality and is easily released, however, in the present embodiment, the layer is mechanically released without carrying out irradiation with laser light beams.

It is sufficient if the resin material 11c is a material which can be burned (hardened by heating). However, as described previously, in a case where the electronic element 12 that formed on the resin film 11 includes an element requiring activation processing such as TFT, the resin material is required to be a material which is durable for the heat treatment, a temperature of the order of 500° C. for example. In addition, at the time of heat treatment, if a difference in thermal expand coefficient (expandability) from the supporting substrate 2 is great, a distortion is likely to occur therebetween, and therefore, it is preferable that the difference in thermal expandability is as small as possible. From this point of view, the thermal expandability of the resin material 11c needs to be made as close to the thermal expandability of the supporting substrate 2 as possible. In the present embodiment, polyimide was used as the resin material 11c. Polyimide is a generic name of a polymeric resin including imide bonding, and can be changed to a film-shaped polyimide by accelerating an imidization reaction, by heating and burning a polyamide acid which is a precursor (liquid at normal temperature). Further, the difference in thermal expandability can be adjusted according to the burning condition, and a degree of intimacy with the supporting substrate 2 can be adjusted, so that a release from the supporting substrate 2 can be made easy. Although the thermal expandability in general polyimide is of the order of 10 ppm/° C. or more and 60 ppm/° C. or less, it is possible to make this thermal expandability close to 4 ppm/° C. which is the thermal expandability of a glass, according to the burning conditions. Apart from polyimide, for example, transparent polyimide, PEN, PET, COP, COC, PC or the like can be used.

The above burning is carried out by overall heating in oven in place of heating of the supporting substrate 2, for example. However, heating may be carried out from a back surface side of the supporting substrate 2. A temperature profile at the time of the above heating can be changed according to the purpose.

In a case where polyimide is used as the resin material 11c, as described previously, the thermal expandability or the degree of intimacy changes depending on the burning conditions. Thus, in accordance with the burning conditions, as described previously, the resin material can be burned under the conditions for the thermal expandability that is close to that of the supporting substrate 2. For example, although in the case of polyimide, burning of the order of 450° C. is made, prebaking is carried out at a low temperature of the order of 80° C. or more and 110° C. or less, and the thermal expandability can be thereby reduced. In addition, a heating speed leading up to the imidization temperature of polyimide is slowed down, and the thermal expandability can be reduced as well. Further, if the heating speed at the time of burning (at the time of heating leading up to the maximum burning temperature subsequent to imidization) is slowed down, the intimacy strength can be thereby increased, or alternatively, if the heating speed is accelerated, the intimacy strength decreases. From these points of view, in burning of the resin film 11, the burning speed leading up to imidization is l°C/min or more and 5° C./min less and preferably 2° C./min or more and 3° C. or less; and it is preferable that the temperature subsequent to imidization be increased up to the burning temperature while being increased at the burning speed at which the value of adhesion can be controlled to the adhesion of Table 1. This range can be further specified by the characteristics of, and the resin material for, the target resin film.

Next, as shown in FIG. 2B, the electronic element 12 is formed on the resin film 11. Although the electronic element 12 is schematically drawn in the figure, in a case where the electronic device is an organic EL display device for example, there is formed a deposition layer in which different organic layers are deposited so as to emit RGB light beams in each subsidiary pixel respectively, and the TFT. Then, electrical wires or the like for driving each pixel are also formed. In addition, if the electronic device is a touch panel, electrodes and their related wiring layers opposing so that a capacitor is formed between the two electrodes are formed. Further, if the electronic device is a liquid crystal display, on one substrate, an electrode is formed together with TFT whereas on the other substrate, two substrates on which the electrodes have been formed are disposed to oppose to each other at predetermined intervals; a liquid crystal material is injected therebetween and polarization films are provided on both surfaces, and the liquid crystal display is thereby formed. The present disclosure is applicable to these electronic devices, and is further applicable to a variety of electronic devices having flexible substrates such as solar batteries.

The steps of FIG. 2C to FIG. 2G that follow the above step are included in a flow of processing operation showing a method for releasing the resin film 11 of the present disclosure. That is, first, as shown in FIG. 2C, the supporting substrate 2 is prepared to be separated into the first part 21 and the second part 22. As described previously, this preparation for separation is carried out by imparting the scribe line at the boundary part C between the first part 21 and the second part 22 and cutting the supporting substrate. If this cutting is strong, the resin film may be released from the first part 21, and however, at this time point, the first part 21 and the second part 22 are not intended to be separated from each other. As described previously, if the supporting substrate 2 is a glass plate or a ceramics substrate, the substrate is cut, and however, in the case of a material which cannot be easily cut, such as a metal plate, temporary securing of the first part 21 and the second part 22 is released. For example, in a case where these two parts are temporarily secured to each other by way of a fastening bracket, the second part 2 is pinched by the pinching tool 3 and thereafter the fastening bracket is removed.

In the pinching tool 3, over the full range in the widthwise direction of the second part 22 of the supporting substrate 2 and the resin film 11, a pinching part 31 that pinches the second part 22 via a buffering part 32 is secured to a driving part which can be moved upward and downward which is not shown. This upward and downward movement may be a movement along a vertical direction to the surface 2a of the first part 21 or may be a movement in an oblique direction. That is, it is sufficient if this movement is a movement having a component of spacing the first part 21 and second part 22 in the vertical direction. The pinching tool 3 is also formed so as to be able to rotate the pinching part 31 around a supporting shaft 33. Consequently, the second part 22 pinched by the pinching part 31 can rotate about the supporting shaft 33.

Afterwards, as shown in FIG. 2D, in a state in which the resin film 11 comes into intimate contact with the surface 2a of the second part 22 of the supporting substrate 2, the first part 21 of the supporting substrate 2 and at least the end edge 22a of the second part 22 adjacent to the first part 21 are relatively moved so as to be spaced from each other in the vertical direction to the surface 2a of the first part 21. The movement in the vertical direction does not mean that the pinching tool 3 moves in the vertical direction to the surface 2a of the first part 21, but means that it is sufficient if such movement has a component of spacing the pinching tool 3 and the surface 2a of the first part 21 in the vertical direction. Therefore, these two parts may be moved in an oblique direction and then spaced from each other. Further, this movement includes a case in which the pinching part 31 rotates about the supporting shaft 33 of the pinching tool 3 for example, and the end edge 22a of the second part 22 thereby moves in the direction in which the end edge is spaced. Furthermore, it is sufficient if a relative movement occurs, and therefore, a holding tool which is not shown, which holds the first part 21, may be lowered, or alternatively, the first part 21 may be lowered by its own weight.

The state in which the second part 22 and the resin film 11 come into intimate contact with each other, as described previously, presupposes that something is uniformly spaced all over the widthwise direction of the resin film 11. In this manner, a part of the resin film 11 is released from the first part 21 by a constant force from one end to the other end in the widthwise direction, and the first part 21 and the resin film 11 tensioning subsequent to such a release form the angle θ. However, even if the resin film 11 and the second part 22 do not always completely come into intimate contact with each other from one end to the other end of the resin film 11, it is sufficient that the resin film can be uniformly released all over the widthwise direction. The angle θ formed between the resin film 11 formed by such a partial release and the first part 21, as described previously, is determined according to the adhesion between the resin film 11 and the first part 21. If the intimacy strength is set so as to become the value described previously, the angle θ is of the order of 10° or more 60° or less, and preferably is of the order 15° or more and 45° or less.

Afterwards, as shown in FIG. 2E and FIG. 2F, with respect to the exposed end part 11b of the intimate contact face between the resin film 11 exposed by the partial release of the resin film 11 and the first part 21 of the supporting substrate 2, the gas or liquid at a constant pressure is blown in the parallel direction to the supporting substrate 2 and all over the width direction of the resin film 11. It is preferable that the constant pressure is a pressure of 0.01 kg/cm$^2$ or more and 0.5 kg/cm$^2$ or less, and it is further preferable that the constant pressure is a pressure of 0.02 kg/cm$^2$ and more and 0.3 kg/cm$^2$ or less.

Figure 4:
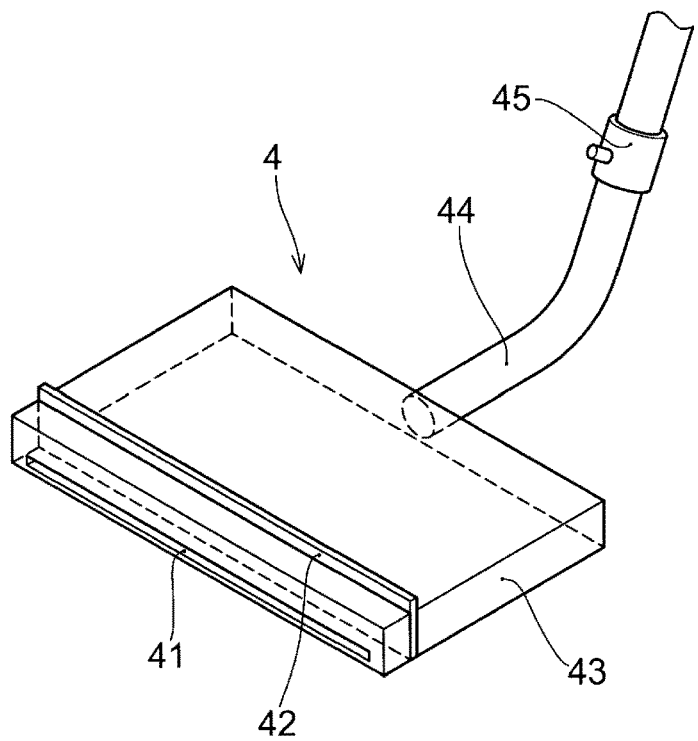
FIG. 4 is an illustrative view showing an example of the blowing tool.

In order to blow the gas or the liquid under the constant pressure in the widthwise direction of the resin film 11, the blowing tool 4 as shown in FIG. 4 for example can be used. That is, an air or the like is filled so as to become a constant pressure in a tank 43 which is closed by a shutter 42, the tank having an ejection port (slit) 41 which covers a width of the resin film 11 at a tip end side and ejects the air or the like; the air or the like can be supplied by way of a hose 44 via a pressure control valve 45; and the shutter 42 is opened to be able to eject the air of a substantially constant pressure in the widthwise direction of the resin film 11. The blowing tool 4 is not limited to such a configuration, and for example, nozzles, each of which is capable of increasing a pressure while a diameter of a tip end decreases towards an end part, are arranged so that the gas under the constant pressure is supplied to a set of these nozzles. Although the foregoing description was furnished by way of example of air blowing, this is also true as to another nitrogen gas, and even by way of liquid such as pure water, liquid ejection under the constant pressure can be carried out in a similar configuration.

As a type of gas for blowing, air or nitrogen gas is preferable from the viewpoint of safety. As a type of liquid for blowing, pure water or alkali ion water or the like can be used. In the case of liquid blowing, it is preferable that the liquid for blowing is a liquid of which temperature is increased. In particular, by blowing liquid of which temperature is increased to 50° C. or more, the resin film is swelled more significantly, and releasing is made easy. In the case of liquid blowing, it is possible to re-collect and reuse the liquid. In addition, at the time of blowing the air or the like, the resin film 11 is released, however, if the resin film 11 is not tensioned, the first part and the resin film 11 come into contact with each other and gas or liquid blowing cannot be carried out, therefore, it is preferable to mutually move the second part 22 so as to be further spaced from the first part 21. That is, it is preferable to blow the gas or the liquid to the exposed end part 11b of the intimate contact face while spacing the second part 22 and the first part 21 from each other in the vertical direction. In the mutual movement, it is sufficient if the resin film can be tensioned and thus it is sufficient if the mutual movement occurs in an oblique direction or in a horizontal direction, or alternatively, the mutual movement is achieved by lowering the first part 21 by its own weight or the like, as long as the tensile stress is applied to the resin film 11. Briefly, as shown in FIG. 2G, it is the easiest way to lift the pinching tool 3 in the vertical direction to the surface 2a. Consequently, a peeling force is hardly applied to the second part 22 and thus the resin film 11 is released by the gas or liquid blowing force. Therefore, a stress is hardly applied to the electronic element 12 on the resin film 11, and the resin film 11 can be released from the supporting substrate 2 without any element degradation.

At this time, as shown in FIG. 2F, the first part 21 and the second art 22 are spaced from each other in the vertical direction and the gas or liquid blowing tool 4 is also advanced concurrently with the release of the resin film 11, and gas or liquid blowing can be directly easily carried out with respect to the exposed end part 11b of the intimate contact face between the resin film 11 and the first part 21. This is preferable. As long as the first part 21 and the second part 22 are spaced from each other in the vertical direction so as to space the end edge 22a of the second part from the surface 2a of the first part 21 in the vertical direction, the angle θ formed between the resin film 11 and the first part 21 of the supporting substrate 2 is maintained to be substantially constant.

Although in the example shown in FIG. 2F described previously, the second part 22, that is, the pinching tool 3 that pinches the second part 22 was spaced from the surface 2a of the first part 21 in the vertical direction, as shown in FIG. 2G the second part 22 may be pulled around the supporting shaft 33 of the pinching tool 3. That is, although the second part 22 is slightly spaced in the vertical direction, the force of pulling something in the horizontal direction is applied. In this case, the second part is not spaced so much in the vertical direction and thus a length of the tensioned resin film 11 increases concurrently with the release of the intimate contact face, therefore, the angle formed between the resin film 11 and the first part 21 is likely to be gradually smaller than θ. Hence, although it may be impossible to keep the blowing tool 4 sufficiently closer to the end part 11b of the intimate contact face, there is no problem because of gas or liquid blowing.

The gas or the liquid under the constant pressure is thus blown in the widthwise direction of the resin film 11, and a uniform pressure is applied to the whole surface without locally applying a force, so that the resin film 11 can be easily released without applying a stress relative to the electronic element 12 on the resin film 11.

In addition, the temperature of the liquid to be blown is increased, and in particular, by blowing the liquid of which temperature is increased to a temperature of the about 50° C. or higher, the resin film 11 on which the electronic element 12 has been formed may be released from the supporting substrate 2. In this case also, as shown in FIG. 2F or FIG. 2G, it is preferable to tension the resin film 11.

Next, a method for manufacturing an organic EL display device having a flexible substrate using the above-described method will be described. Note that, a method for manufacturing individual parts thereof is the same as that for the conventional organic EL display device that is formed on a glass substrate, and a detailed description thereof is omitted.

Figure 6:
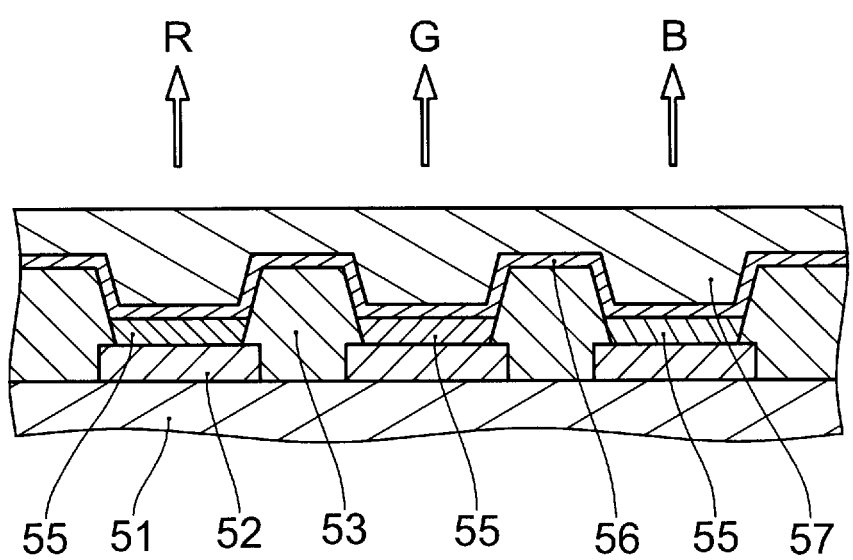
FIG. 6 is an illustrative view showing a state in which an organic layer is formed on each subsidiary pixel of RGB in a part of the step of manufacturing an organic EL display.
Figure 7:
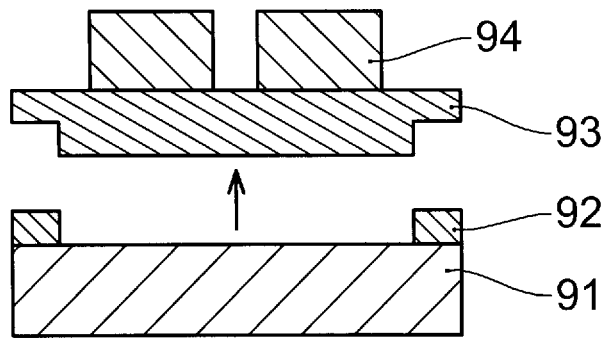
FIG. 7 is a view showing an example of a conventional method for releasing a resin film.
Figure 8A:
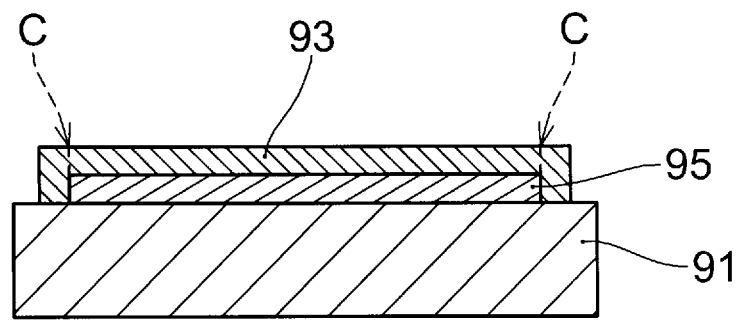
FIG. 8A is a view showing another example of the conventional method for releasing the resin film.
Figure 8B:
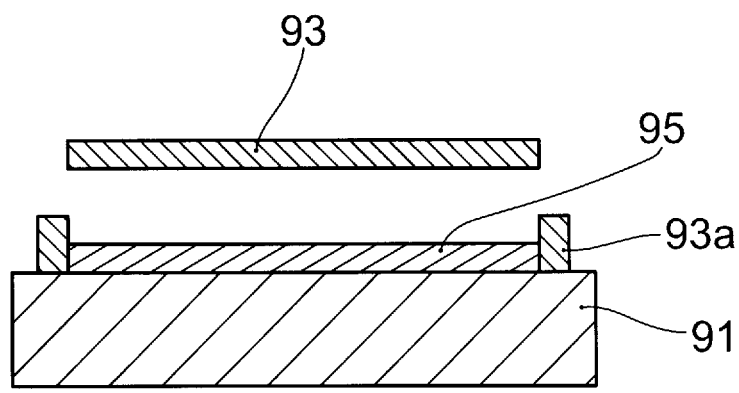
FIG. 8B is a view showing another example of the conventional method for releasing the resin film.

According to the method for manufacturing the organic EL display device of the present disclosure, as shown in FIG. 2A described previously, the liquid resin is coated and burned (hardened) on the supporting substrate 2, and the resin film 11 as a flexible substrate is formed. And, as a sectional view of a part of the organic EL display device is shown in FIG. 6, TFT and its electrical wire which are not shown are formed on the flexible substrate. That is, a switching element such as TFT is formed for each RGB subsidiary pixel of each pixel, and a first electrode (for example, anode) connected to the switching element is formed on the flattened layer 51 in accordance with a combination between a metal layer such as Ag or APC and an ITO film. That is, in an anodic electrode of an organic element, ITO is used from the viewpoint of positive hole injection property. Between the subsidiary pixels, as shown in FIG. 6, an insulation bank 53 made of $SiO_2$, which shades a gap between the subsidiary pixels, are formed. On the insulation bank 53 of such a flattened layer 51, a vapor deposition mask which is not shown is aligned and secured and then an organic deposition layer 55 is vapor-deposited. The vapor deposition step is carried out as to each subsidiary pixel while the vapor deposition masks are sequentially changed. In this case, there may also be used a vapor deposition mask in which a same material is vapor-deposited to a plurality of subsidiary pixels.

Although in FIG. 6, the organic deposition layer 55 is shown as one layer, in practice, the organic deposition layer 55 is formed by a plurality of deposition layers of different materials. As a layer contacted to the anode 52 for example, there may be used a positive hole injection layer made of a material which improves positive hole injection property by well compatible ionization energy with the anode. On the positive hole injection layer, a positive hole transport layer, which improves constant positive hole transport, and which is capable of closing electrons in a light emitting layer (energy barrier), is formed of an amine-based material for example. Further, on the above transport layer, a light emitting layer which is selected according to a light emitting wavelength is formed by doping a red or green organic fluorescent material in $Alq_3$ relative to red or green, for example. In addition, as a blue-based material, a DSA-based organic material is used. On the light emitting layer, an electronic transport layer, which further improves electron injection property and constantly transports electrons, are formed of $Alq_3$ or the like. These layers are respectively deposited on the order of several tens of nm, and the organic deposition layer 55 is thereby formed. Between the organic layer and a metal electrode, an electron injection layer which improves injection property of electrons such as LiF or Liq may be provided.

Of the organic deposition layer 55, an organic layer made of a material according to each color of RGB is deposited as a light emitting layer. In addition, it is preferable that the positive hole transport layer and the electron transport layer or the like is made of a material which is suitable for the light emitting layer and is deposited separately if the light emitting performance is regarded mainly. However, in view of material costs, these layers may also be deposited with a same material in common to two colors or three colors of RGB. In a case where a common material is deposited in subsidiary pixels of two or more colors, a vapor deposition mask is formed while an aperture is formed in common subsidiary pixels. In a case where different vapor deposition layers are formed in individual subsidiary pixels, the respective organic layers can be continuously vapor-deposited using one vapor deposition mask in subsidiary pixel of R, for example, or alternatively, in a case where a common organic layer is deposited in RGB, vapor deposition of the organic layer in each subsidiary pixel is carried out up to a lower side of the common layer, and at the common organic layer is deposited in all the pixels is carried out one time, using the vapor deposition mask in which an aperture has been formed in RGB.

Then, after formation of an organic deposition layer 55 formed of all the organic layers and electron injection layers such as a LiF layer has formed, a vapor deposition mask which is not shown is removed, and a second electrode (for example, cathode) 56 is formed on a whole surface. According to the example shown in FIG. 6, a top emission type, that is, the type of emitting light from an upper side is employed and thus the second electrode 56 is formed of a light transmissive material, for example, a thin-film Mg—Ag eutectic layer. As another example, Al or the like can be used. On a surface of the second electrode 56, a protection layer 57 made of $Si_3N_4$ for example is formed. The entirety thereof is sealed with a sealing layer made of a resin film or the like which is not shown, and is configured so that the organic deposition layer 55 does not absorb moisture. In addition, it is also possible to provide a structure in which organic layers are used as commonly as possible and a color filter is provided on a surface side thereof.

Although a device for releasing a resin film of the present disclosure is not entirely illustrated, as described previously, there is provided the pinching tool 3 that pinches the second part 22 so as to be able to be moved. The pinching tool 3 is structured to be able to pinch the resin film 11 so as to come into intimate contact with the surface 2a of the second part 22 from one end to the other end in the widthwise direction thereof. In addition, there is provided a holding tool (not shown) of the first part 21 which holds the first part 21 of the supporting substrate 2, in which movement in the vertical direction to the surface 2a of the first part 21 is limited, and which is movable in the parallel to the surface 2a and in the direction connecting the first part 21 and the second part 22 to each other. Further, there is provided a first driving part (not shown) which spaces the pinching tool 3 of the second part 22 and the holding tool of the first part 21 from each other in the vertical direction to the surface 2a while maintaining parallelism between at least the end edge 22a on the side of the first part 21 of the second part 22 and the surface 2a of the first part 21; and the releasing device (device for releasing) is configured to include the blowing tool 4 that applies a gas or liquid pressure from a gap which is formed between the resin film and the surface 2a of the first part 21 by a part of the resin film 11 being released from the first part 21 due to a release between the first part 21 and the second part 22. In the case of liquid blowing, it is preferable to provide a heating device for heating the liquid, in particular a heating device for heating the liquid to 50° C. or more. However, from the viewpoint of preventing thermal degradation of an organic material, it is preferable that the temperature of the liquid be limited to 80° C. or less. Thus, in addition to the heating device, it is preferable that a thermometer for measuring the temperature of the liquid is further provided, and a system for controlling the temperature of the liquid to a desired value is configured. The holding tool, the driving part, the thermometer, and the controlling system can be configured by a general mechanical device.

It is preferable that the blowing tool 4 further have a second driving part which moves the blowing tool 4 so as to close to the exposed end part 11b along the surface 2a of the first part 21, concurrently with movement of the exposed end part 11b of the intimate contact face between the first part 21 and the resin film 11.

REFERENCE SIGNS LIST

1 Electronic device
11 Resin film (flexible film)
11a Release part
11b Exposed part of intimate contact (adhered) face
12 Electronic element
2 Supporting substrate
21 First part
22 Second part
22a End edge
22b Opposite end edge
3 Pinching tool
31 Pinching part
32 Buffering part
33 Supporting shaft
4 Blowing tool
41 Ejection port (slit)
42 Shutter
43 Tank
51 Flattened layer
52 First electrode (anode)
53 Bank
55 Organic deposition layer
56 Second electrode (cathode)
57 Protection layer
6 Slot die

What is claimed is:

1. A method for releasing a resin film formed adhered with a surface of a supporting substrate, from the supporting substrate, the method comprising:
    applying and hardening a liquid resin on the supporting substrate to form the resin film;
    forming an electronic element on the resin film;
    preparing for separating the supporting substrate into a first part and a second part;
    generating a partial release between the resin film and the first part, by relatively moving the first part and an end edge of the second part adjacent to the first part so as to be spaced from each other in a vertical direction to a surface of the first part, while the resin film adhering with a surface of the second part of the supporting substrate; and
    applying a blowing force with a gas or a liquid at a constant pressure in a widthwise direction of the resin film in a parallel direction to the supporting substrate at an end part of an adhered face between the resin film exposed by the partial release and the first part.

2. The method for releasing the resin film according to claim 1, wherein the partial release of the resin film is performed with an angle $\theta$ of 10° or more and 60° or less between the resin film and the first part of the supporting substrate.

3. The method for releasing the resin film according to claim 1, wherein the blowing of the gas or the liquid under the constant pressure is carried out by ejecting the gas or the liquid from an ejection part of a blowing tool, and is carried out by relatively moving the supporting substrate and the blowing tool while an angle $\theta$ formed between the resin film and the first part of the supporting substrate is substantially constant, and the second part and the first part are relatively moved so as to be spaced from each other in a vertical direction to the surface of the second part.

4. The method for releasing the resin film according to claim 1, wherein the blowing of the gas or the liquid under the constant pressure is carried out by ejecting the gas or the liquid from an ejection part of a blowing tool, and is carried out by relatively moving the supporting substrate and the blowing tool, in a state of the second part being spaced from the first part so that a distance between the ejection part of the blowing tool of the gas or the liquid and a released part between the resin film and the first part is substantially constant while the second part is pulled around a rotating supporting shaft provided on a position parallel to the end edge.

5. The method for releasing the resin film according to claim 1, wherein the blowing of the gas or the liquid under the constant pressure is carried out by connecting a gas source or a liquid source to a tank, via a valve under a constant pressure, the tank covering a width of the resin film, and forming, on a face of the tank, an ejection port formed of a slit at covering the width of the resin film, and ejecting and blowing the gas or the liquid at a constant pressure from the ejection port of the tank.

6. The method for releasing the resin film according to claim 1, wherein blowing of the liquid is carried out by blowing of heated liquid.

7. The method for releasing the resin film according to claim 1, wherein the blowing of the gas or the liquid under the constant pressure is carried out at a pressure of 0.01 kg/cm$^2$ or more and 0.5 kg/cm$^2$ or less.

8. The method for releasing the resin film according to claim 1, wherein the supporting substrate is made of a glass plate or a ceramic substrate, and the step of separating the supporting substrate into the first part and the second part is carried out by cutting the supporting substrate along a scribe line provided on an opposite surface to a surface formed with the resin film of the supporting substrate.

9. The method for releasing the resin film according to claim 1, wherein the supporting substrate is made of a metal plate or a semiconductor substrate, and the first part and the second part are connected to be attachable to or detachable from each other.

10. A method for manufacturing an electronic device having a flexible substrate, comprising:
   forming a flexible resin film on a surface of a supporting substrate having a first part and a second part;
   forming an electronic element on a surface of the flexible resin film; and
   releasing the flexible resin film with the electronic element from the supporting substrate,
   wherein the releasing of the flexible resin film is carried out by the method according to claim 1.

11. The method for manufacturing the electronic device according to claim 10, wherein the resin film is formed by applying a liquid resin made of polyimide onto the supporting substrate and hardening the resin film so that an adhesion strength between the resin film and the supporting substrate is 0.1 N/10 mm or more and 1N/10 mm or less to thereby form the resin film.

12. A method for manufacturing an organic EL display device having an organic EL element on a flexible substrate, the method comprising:
   applying and hardening a liquid resin on a supporting substrate, and forming the flexible substrate,
   forming, on the flexible substrate, the organic EL element comprising TFT, in a matrixed shape, and forming a sealing member for sealing the organic EL element;
   separating the supporting substrate into a first part and a second part, the first part including a part at which the sealing member is formed, and the second part being other than the first part;
   generating a partial release between the flexible substrate and the first part in a state of the flexible substrate coming into adhesion with a surface of the second part, by relatively moving the first part and an end edge of the second part in parallel to each other and so as to be spaced from each other in a vertical direction to a surface of the first part; and
   applying a pressure with a gas or a liquid so as to be parallel to the supporting substrate to an end part of an adhered face between the flexible substrate exposed by the partial release and the first part.

13. A device for releasing a resin film, comprising:
   a pinching tool for pinching a second part, the pinching tool pinching all over a widthwise direction the second part of a supporting substrate having a first part and a second part, the supporting substrate being provided with a resin film adhered on a surface thereof;
   a holding tool for holding the first part, the holding tool being limited in a movement in a vertical direction to a surface of the first part and being able to move in a parallel direction to the surface of the first part and in a direction connecting the first part and the second part to each other;
   a first driving part for spacing the pinching tool and the holding tool from each other in the vertical direction while maintaining parallelism between an end edge of the second part and the first part; and
   a blowing tool for applying a gas or liquid pressure all over a widthwise direction of the resin film from a gap formed between the resin film and the surface of the first part when a part of the resin film is released from the first part by a release between the first part and the second part.

14. The device for releasing the resin film according to claim 13, further comprising a second driving part for moving the blowing tool on the surface of the first part, concurrently with movement of an exposed end part of an adhered face between the first part and the resin film, so as to approach the exposed end part.

* * * * *